(12) United States Patent
Liu et al.

(10) Patent No.: US 11,846,957 B1
(45) Date of Patent: Dec. 19, 2023

(54) SIGNAL DRIVER CIRCUIT

(71) Applicant: NXP USA, Inc., Austin, TX (US)

(72) Inventors: Xiaoqun Liu, Chandler, AZ (US);
Siamak Delshadpour, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/931,384

(22) Filed: Sep. 12, 2022

(51) Int. Cl.
*G05F 1/56* (2006.01)
*H03K 3/013* (2006.01)

(52) U.S. Cl.
CPC .............. *G05F 1/56* (2013.01); *H03K 3/013* (2013.01)

(58) Field of Classification Search
None
See application file for complete search history.

(56) References Cited

U.S. PATENT DOCUMENTS

| | | | |
|---|---|---|---|
| 8,493,103 B2 | 7/2013 | Fukuda et al. | |
| 8,878,568 B1 * | 11/2014 | Farzan | H03K 19/00384 326/82 |
| 8,885,691 B1 * | 11/2014 | Ren | G05F 1/10 375/319 |
| 9,046,909 B2 * | 6/2015 | Leibowitz | G11C 29/028 |
| 9,513,655 B1 | 12/2016 | Liu et al. | |
| 9,537,479 B2 * | 1/2017 | Song | H03K 19/0185 |
| 9,582,454 B2 * | 2/2017 | Hsueh | G06F 13/36 |
| 9,819,523 B2 * | 11/2017 | Lee | H04L 25/03878 |
| 9,853,642 B1 * | 12/2017 | Tan | H03M 9/00 |
| 9,887,710 B1 * | 2/2018 | Lim | H02M 3/158 |
| 10,156,861 B2 * | 12/2018 | Coimbra | G05F 1/575 |
| 10,469,070 B1 * | 11/2019 | Liu | H03K 19/0021 |
| 10,491,436 B1 * | 11/2019 | Lim | H03K 19/017545 |
| 11,165,610 B1 | 11/2021 | Delshadpour | |

OTHER PUBLICATIONS

Emami-Neyestanak, A. et al.; "A 6.0-mW 10.0-GB/s Receiver With Switched-Capacitor Summation DFE", IEEE Journal of Solid-State Circuits, vol. 42, No. 4, pp. 889-896, Apr. 2007.
Kim, S. et al.; "A 5.2-GB/s Low-Swing Voltage-Mode Transmitter With an AC-/DC-Coupled Equalizer and a Voltage Offset Generator"; in IEEE Transactions on Circuits and Systems—I: Regular Papers, vol. 61, No. 1, pp. 213-225, Jan. 2014.

(Continued)

*Primary Examiner* — Thomas J. Hiltunen

(57) ABSTRACT

One example discloses a signal driver circuit, including: an input configured to receive an input signal; an output configured to transmit an output signal; a low drop-out voltage regulator (LDO) having a regulated voltage output; a set of voltage-modulated amplifiers having a first input coupled to the regulated voltage output, and a second input configured to receive the input signal; wherein the voltage-modulated amplifier is configured to amplify the input signal and transmit an amplified input signal on the output of the signal driver circuit; a de-emphasis controller, including a set of de-emphasis levels; wherein the de-emphasis controller is configured to selectively switch-on a first subset of the set of voltage-modulated amplifiers and switch-off a second subset of the set of voltage-modulated amplifiers based on the de-emphasis levels.

20 Claims, 13 Drawing Sheets

(56) References Cited

OTHER PUBLICATIONS

Lin, Z.; "Understanding the embedded USB2 (eUSB2) standard"; retrieved from internet https://e2e.ti.com/blogs_/b/analogwire/posts/understanding-embedded-usb2-eusb2 on Sep. 12, 2022; Aug. 19, 2019; 3 pages.

Noguchi, R. et al.; "A 25-GB/s Low-Power Clock and Data Recovery with an Active-Stabilizing CML-CMOS Conversion"; 2018 25th IEEE International Conference on Electronics, Circuits and Systems, Bordeaux, France; pp. 49-52, Dec. 2018.

Texas Instruments; "TUSB2E22 eUSB2-USB 2.0 Dual Repeater"; SNLS648A, Feb. 2019—Revised Dec. 2019; 26 pages.

Tondo, D. F. et al.; "A Low-Power, High-Speed CMOS/CML 16:1 Serializer"; Argentine School of Micro-Nanoelectronics, Technology and Applications, San Carlos de Bariloche, Argentina; pp. 81-86, Oct. 2009.

U.S. Appl. No. 17/448,515, filed Sep. 22, 2021, 26 pages.
U.S. Appl. No. 17/406,405, filed Aug. 19, 2021, 33 pages.

\* cited by examiner

SIGNAL DRIVER CIRCUIT

The present specification relates to systems, methods, apparatuses, devices, articles of manufacture and instructions for various signal driver circuit applications.

SUMMARY

According to an example embodiment, a signal driver circuit, comprising: an input configured to receive an input signal; an output configured to transmit an output signal; a low drop-out voltage regulator (LDO) having a regulated voltage output; a set of voltage-modulated amplifiers having a first input coupled to the regulated voltage output, and a second input configured to receive the input signal; wherein the voltage-modulated amplifier is configured to amplify the input signal and transmit an amplified input signal on the output of the signal driver circuit; a de-emphasis controller, including a set of de-emphasis levels; wherein the de-emphasis controller is configured to selectively switch-on a first subset of the set of voltage-modulated amplifiers and switch-off a second subset of the set of voltage-modulated amplifiers based on the de-emphasis levels.

In another example embodiment, the first subset is a set of un-delayed voltage-modulated amplifiers and the second subset is a set of delayed voltage-modulated amplifiers; and the de-emphasis levels are set based on a ratio of the set of un-delayed voltage-modulated amplifiers to the set of delayed voltage-modulated amplifiers.

In another example embodiment, the de-emphasis levels include a first de-emphasis level and a second de-emphasis level.

In another example embodiment, the de-emphasis controller is configured to switch-on all of the voltage-modulated amplifiers for the first de-emphasis level.

In another example embodiment, a voltage ripple at the output of the signal driver circuit decreases as the switched-on voltage-modulated amplifiers in the second subset increases.

In another example embodiment, a de-emphasis of the input of the signal driver circuit increases as the switched-on voltage-modulated amplifiers in the second subset increases.

In another example embodiment, further comprising a set of de-emphasis dummy loads coupled between the regulated voltage output and a reference potential; and wherein each de-emphasis dummy load in the set of de-emphasis dummy loads is configured to draw a de-emphasis dummy load current from the regulated voltage output of the LDO if the de-emphasis dummy load is switched-on.

In another example embodiment, the set of voltage-modulated amplifiers are configured to draw a first current; the set of de-emphasis dummy loads are configured to draw a second current; and a summation of the first current and the second current is substantially a constant current.

In another example embodiment, the set of de-emphasis dummy loads are coupled to receive the input signal.

In another example embodiment, the de-emphasis levels include a first de-emphasis level and a second de-emphasis level.

In another example embodiment, the de-emphasis controller is configured to switch-off all of the de-emphasis dummy loads for the first de-emphasis level.

In another example embodiment, the de-emphasis controller is configured to switch-on at least one of the de-emphasis dummy loads for the second de-emphasis level.

In another example embodiment, the LDO is a capless LDO.

In another example embodiment, the signal driver circuit is completely embodied in a single integrated circuit.

In another example embodiment, the signal driver circuit is an e-USB transmit signal driver circuit.

In another example embodiment, the input signal is a differential input signal; and the output signal is a differential output signal.

In another example embodiment, further comprising a start-up dummy load coupled between the regulated voltage output and a reference potential; wherein the start-up dummy load is coupled to receive the input signal and configured to draw a start-up dummy load current from the regulated voltage output of the LDO; and wherein the dummy load current equals a first current when the input signal is in a first state and equals a second current when the input signal is in a second state.

In another example embodiment, the dummy load includes a NOR gate, a switch, and a dummy impedance; the output of the signal driver circuit is configured to be coupled to a load termination impedance (R_Term); and the dummy impedance is equal to twice the termination impedance (R_Term).

In another example embodiment, the voltage mode line driver is configured to draw a voltage-mode line driver current; and a summation of the voltage mode line driver current and the start-up dummy load current is substantially a constant current.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
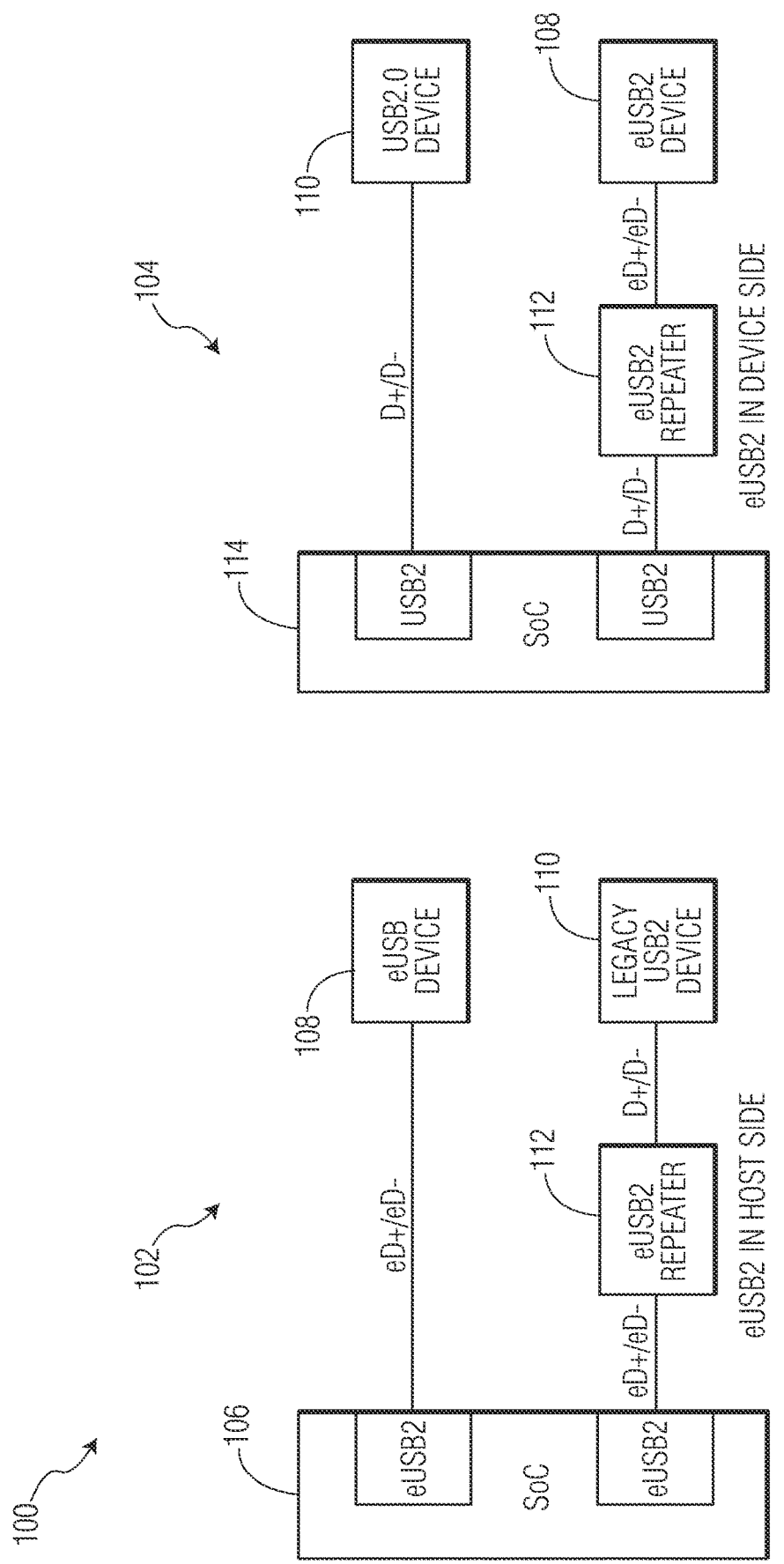
FIGS. 1A and 1B represents examples of two eUSB to USB configurations requiring level-shifting.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Minimizing ripple, logic-conversion, signal-interfacing, etc. all refer to ensuring glitch-free electrical compatibility between one or more electrical circuits, modules, or systems. In the discussion herein, circuits are discussed for minimizing ripple in an eUSB or USB high-speed transmit (TX) driver that can cause signal level errors (e.g. bit errors); however, the concepts and examples discussed applied to a wide variety of such signal driver circuits. Just one example application employing such circuits is now presented for Universal Serial Bus (USB) repeaters.

USB (e.g. v2.0) has been one of the most successful wired interfaces in the past 20 years, and almost all SoCs today are equipped with a USB 2.0 interface. USB standards evolution kept the original 3.3-V I/O USB 1.0 interface intact for backward compatibility, helping enable wider adoption and a larger ecosystem while also preserving device interoperability. However, as process nodes approach more advanced node (e.g. 5 nm), the manufacturing cost to maintain USB 2.0 3.3V I/O signaling has grown exponentially.

Embedded USB2 (eUSB2) is a supplement specification to the USB 2.0 specification that addresses issues related to interface controller integration with advanced system-on-chip (SoC) process nodes by enabling USB 2.0 interfaces to operate at I/O voltages of 1V or 1.2V instead of 3.3V. eUSB2 can enable smaller, more power-efficient SoCs, in turn enabling process nodes to continue to scale while increasing performance in applications such as smartphones, tablets and notebooks. In some examples, designers integrate the eUSB2 interface at a device level while leveraging and reusing the USB 2.0 interface at a system level. eUSB2 can support onboard inter-device connectivity through direct connections as well as exposed connector interfaces through an eUSB2-to-USB 2.0 repeater for performing level shifting.

The following Table presents some differences between USB 2.0 and eUSB2:

| Feature | USB 2.0 | eUSB2 |
| --- | --- | --- |
| Signal interface | D+, D− | eD+, eD− |
| I/O voltage | 3.3 V (Lowspeed/full-speed), <1 V (Highspeed) | 1 V or 1.2 V |
| Supported data rate | Low speed: 1.5 Mbps<br>Full speed: 12 Mbps<br>High speed: 480 Mbps | Low speed: 1.5 Mbps<br>Full speed: 12 Mbps<br>High speed: 480 Mbps |

FIGS. 1A and 1B represents examples 100 of two eUSB to USB configurations 102, 104 requiring level-shifting.

The first configuration 102 includes a system on a chip (SoC) having two eUSB embedded interfaces (as shown). The chip 106 is configured to be coupled to an external eUSB device 108 and to a legacy USB2 device 110. An eUSB2 repeater 112 is necessary to convert a differential eUSB signal (eD+/eD−) to a differential USB signal (D+/D−). The eUSB2 repeater 112 in some examples is on a same PC board as the chip 106, while the eUSB 108 and USB 110 devices are coupled via cabling.

The second configuration 104 is substantially similar to the first configuration 102, except now an SoC 114 includes two USB2 embedded interfaces (as shown).

Figure 2:
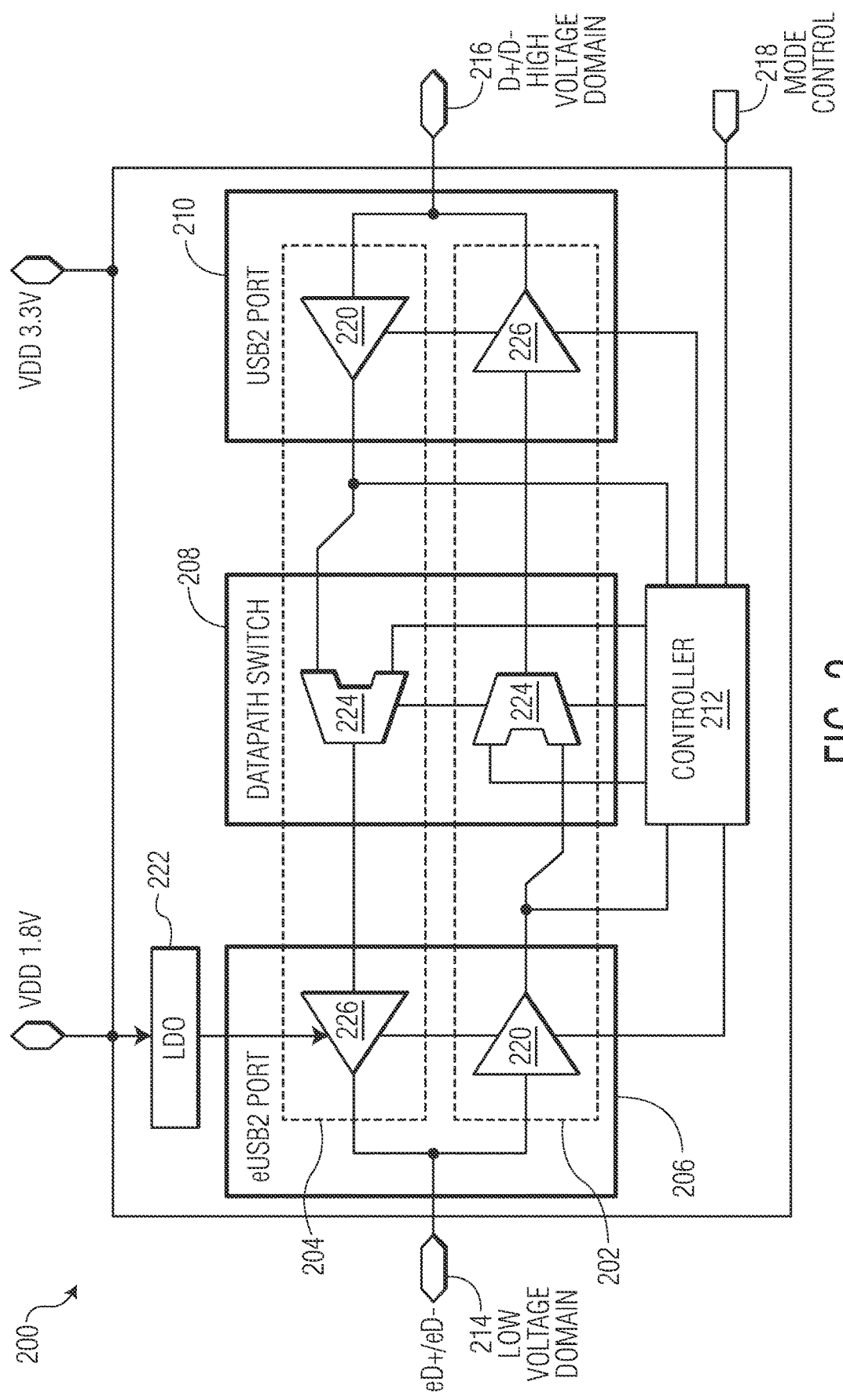
FIG. 2 represents an example bi-directional eUSB to USB2 repeater.

FIG. 2 represents an example bi-directional eUSB repeater 200. This example repeater follows the first configuration 102 example in FIG. 1A, but in another example embodiment could follow the second configuration 104 in FIG. 1B.

The repeater 200 includes a transmit datapath 202, a receive datapath 204, an eUSB2 port 206, a datapath switch matrix 208, a USB2 port 210, and a controller 212. The repeater 200 is configured to be coupled to differential eUSB signals (eD+/eD−) 214 in a low voltage domain, and differential USB signals (D+/D−) 216 in a high voltage domain. Power supplies VDD 1.8V, VDD 3.3 V and a mode control 218 signal are also shown.

The transmit and receive datapaths 202, 204 are substantially similar and include: a first stage 220, a datapath switch 224, and a transmit (TX) line-driver 226.

The first stage 220 includes, equalizer, gain circuits and slicer. The slicer circuit makes a (non-linear) hard decision and makes the data signal either high or low, which avoids propagation of amplitude noise and allows regeneration of pre-emphasis.

The equalizer circuit in various example embodiments is a continuous time linear equalizer (CTLE) (i.e. a feed forward equalizer (FFE)) for removing most intersymbol interference (ISI), due to input and termination resistors (R_Term). R_Term can be different for different standards (e.g. for an USB2 to an eUSB repeater, input R_Term=45Ω, output R_Term=40Ω).

The repeater 200 also includes a low drop-out voltage regulator (LDO) 222 which provides power to the TX line-driver 226, because USB2 is in 3.3V domain and while most of the platforms have 1.8V available, 1.2V source needs to be generated internally from 1.8V supply by the LDO 222, and not from the 3.3V supply for lower power consumption. In case USB2 to eUSB repeater 200 shown, the eUSB side will need to use a 1.8V to 1.2V LDO 222 for low-speed (LS) applications, and a 1.2V and 0.4V LDO for high-speed (HS) applications.

Traditional LDOs are coupled to an external capacitor and are simple to design and provide good regulated output, but are area consuming due to the off-chip external capacitor which also needs a dedicated pin from the LDO. Due to the external capacitor, such LDOs will provide a solid 0.4V output, since the external capacitor holds the required charge to keep the LDO's output voltage stable even while the LDO output current changes significantly. The external capacitor however acts as a fixed load and is thus always current consuming and not preferable (e.g. load current is ~2.5 mA and IL needs to be ~10 mA to do the job, the extra ~10 mA current is not preferably in a low-current application.

Capless LDOs 222 in contrast are attractive due to their small area and removing need of off-chip capacitor. However, sourcing the mA range signal bit currents needed by the voltage-mode line-driver 226 causes a collapse of the capless LDO's 222 output voltage due to the capless LDO's 222 small/zero value capacitor. Since it will take some time for the capless LDO 222 to adjust signal bit changes (i.e. the capless LDO is not fast enough to be ready to deliver a required (2.5 mA) load (0.4V/4R_Term, R_Term=40Ω) and output voltage swing may be up to 240 mV, depending on the LDO design and value of the integrated capacitor), a few signal bits may be corrupted at startup which can violate the USB2/eUSB standard.

Additionally, switching de-emphasis levels (i.e. in the first stage 220) of the USB2/eUSB repeater can result in excessive output voltage ripple due to the capless LDO's 222 load current sourcing limitations (i.e. de-emphasis loading changes periodically in nano-second range and a capless LDO may not be able to track the changing load fast enough which means quality of output signal will drop). This voltage ripple will be seen at output of voltage mode driver and can affect a quality of the line-driver's 226 output voltage, especially in high-speed applications.

As power efficiency becomes increasingly critical in computing devices, there is a need for IO technology to be optimized for startup, active and idle power scenarios. USB2.0 technology, originally optimized for external device interconnect, is primed to be enhanced for inter-chip interconnect such that the link power can be further optimized.

Figure 3A:
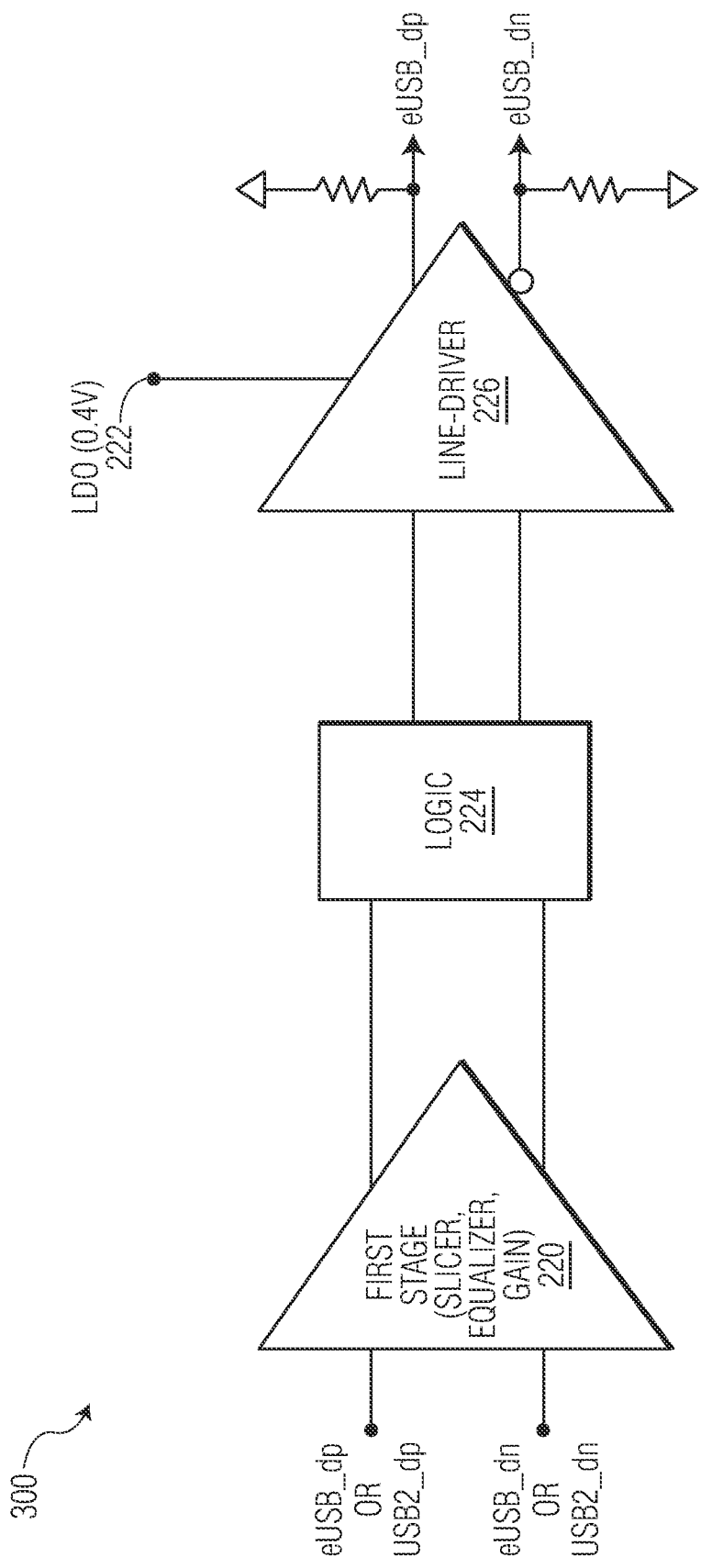
FIG. 3A represents another example of the datapath in the repeater.

FIG. 3A represents another example 300 of the datapath 204 (e.g. the USB2 to eUSB signal conversion) in the repeater 200.

Figure 3B:
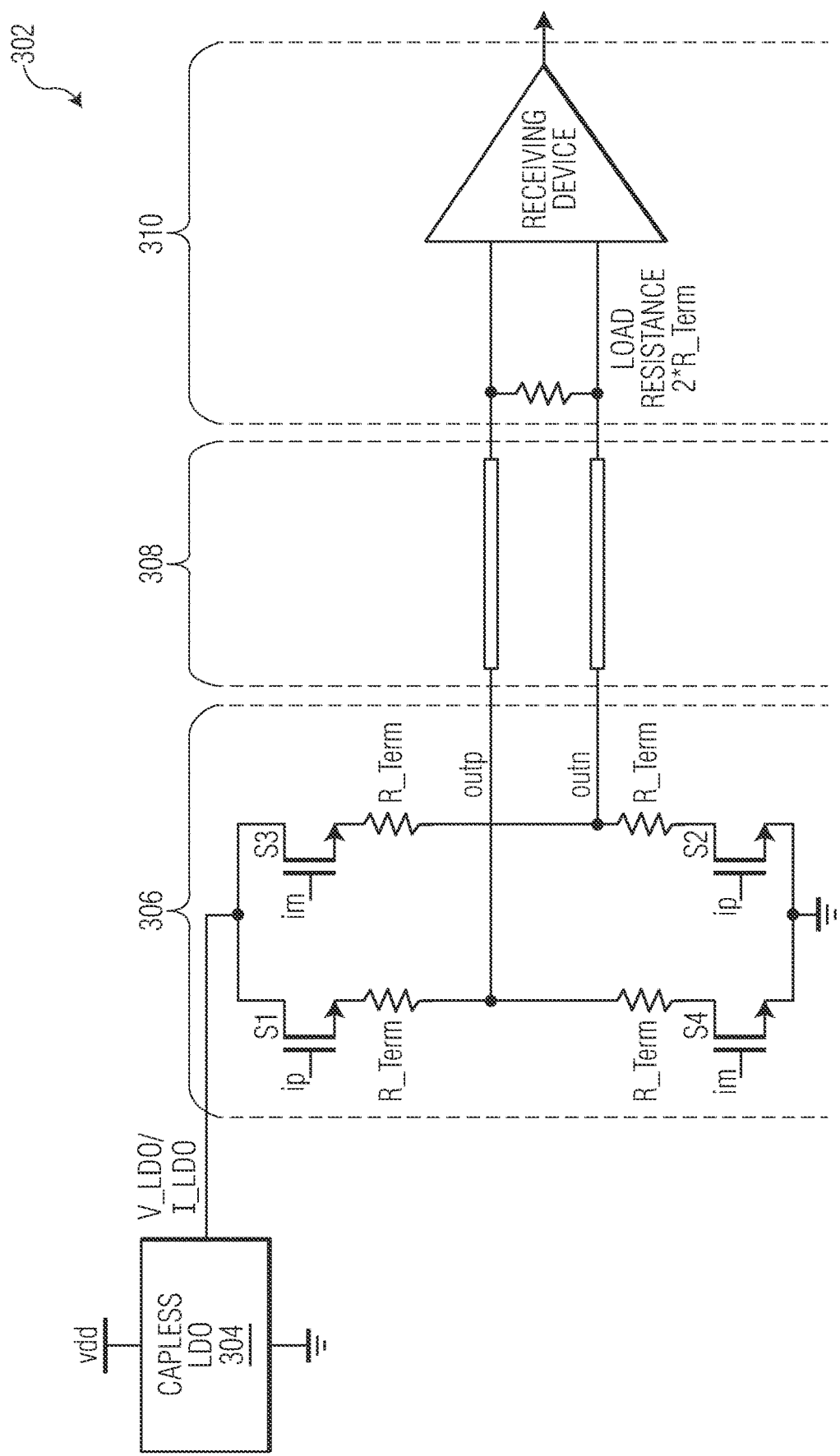
FIG. 3B represents an example of the LDO and the line-driver (voltage mode TX driver) in the repeater 200.

FIG. 3B represents an example 302 of the LDO 222 and the line-driver 226 in the repeater 200. In this example 302, a capless LDO 304 (i.e. no external capacitor) is coupled to a voltage-mode line driver 306, which is itself coupled to a communications channel 308 that is coupled to a receiving device 310, as shown.

As background, current-mode drivers use Norton-equivalent parallel terminations, which makes controlling output impedance for signal integrity considerations (e.g. min. reflections) rather straightforward. In contrast, voltage-mode drivers use Thevenin-equivalent series termination, which uses potentially ½ to ¼ of the current as a current-mode driver for a given output voltage swing. Thus an ideal voltage-mode driver is not only able to interface signals with a differential receiver (RX) termination, but can do so with a potential 4× reduction in TX driver power. Voltage-mode driver implementation depends on a TX driver's output swing requirements, and can be configured as either Low-Swing or High-Swing. For a low-swing application (<400-500 mVpp) an all NMOS driver may be used, while for high-swing applications CMOS driver may be used.

The capless LDO 304 is designed on-chip to reduce a cost of the device, and therefore, the LDO 304 is very low speed with gain-bandwidth at the level of 100 MHz or even lower also in order to reduce power consumption. When the voltage-mode line driver 306 is disabled, both ip and im are low and the MOS switches in the transmitter are off and the transmitter draws no current from the LDO 304.

During the startup, either the differential input signals ip or im toggle from low to high and S1 and S2, or S3 and S4 are enabled and the transmitter starts to draw a high current from the LDO 304.

The current can be calculated as I_transmitter=V_LDO/(4*R_Term). The resistance of these switches, S1, S2, S3 and S4, is not included in this calculation for simplicity. The current can be very high, for example, V_LDO=0.4V, R_Term=40 Ohms, then the current I_LDO=2.5 mV. Since the transmitter is designed to be very high speed to transmit high-speed signal with 1 UI equal to 2 nS or even less, the transition of current drawn from the LDO 304 from 0 mA to 2.5 mA can be as fast as 1 nS or even faster. This causes a voltage ripple on the LDO output during transmitter startup because of the on-chip low speed LDO results in the output of the LDO 304 V_LDO experiencing a very large voltage drop.

Figure 4:
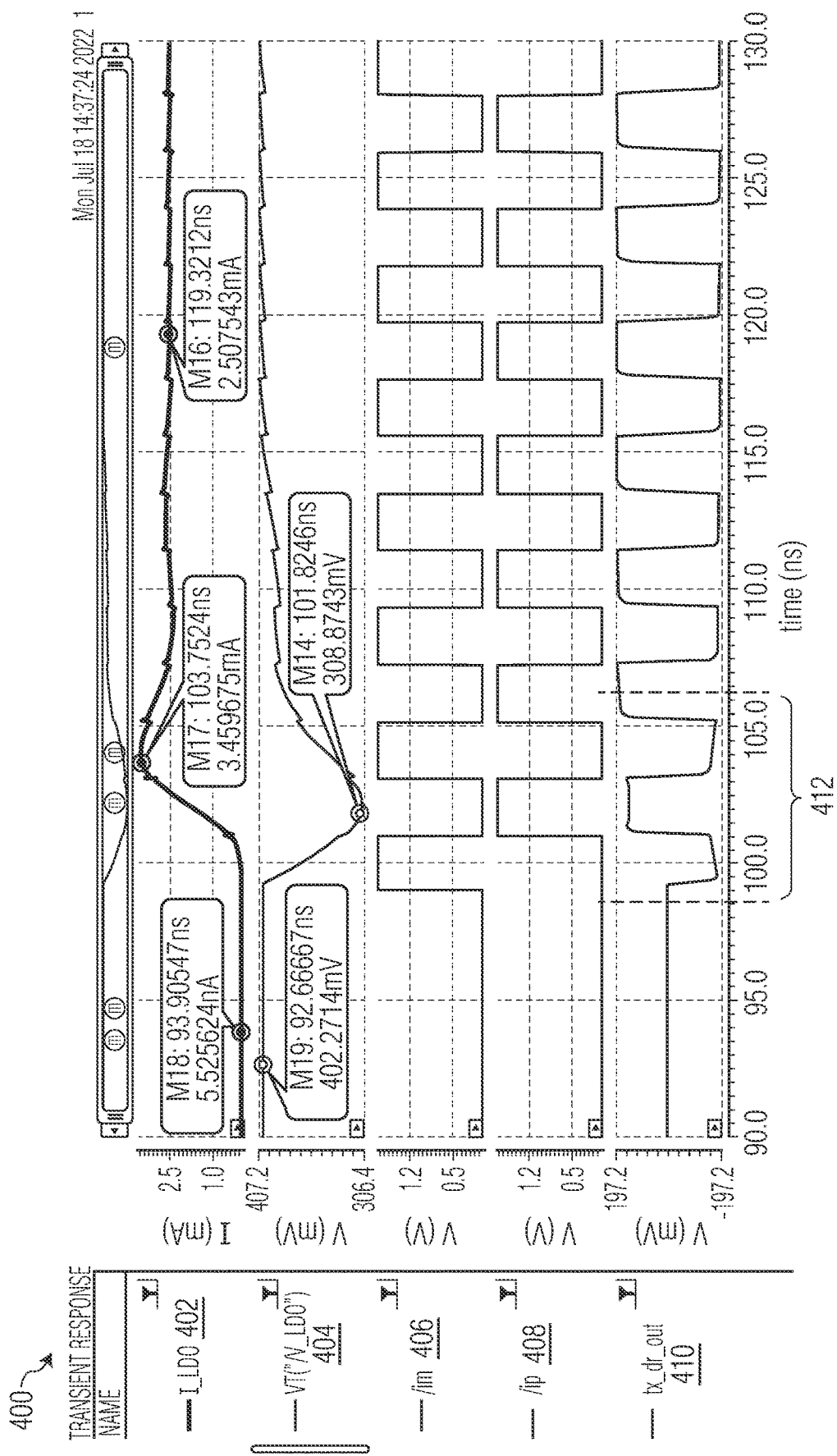
FIG. 4 represents an example timing diagram for a capless LDO supplied line-driver.

FIG. 4 represents an example timing diagram 400 for the capless LDO 304 supplied line-driver 306. The example timing diagram 400 shows I_LDO 402 and V_LDO 404 output by the capless LDO 304, as well as differential input signals (Im 406 and Ip 408) received by the voltage-mode line driver 306 and one differential output signal 410 (tx_dr_out) generated by the voltage-mode line driver 306. A second differential output signal from the voltage-mode line driver 306 is similarly affected.

Corrupted bits 412 from the voltage-mode line driver 306 due to the very large voltage drop (see V_LDO waveform) of the LDO 304 at startup are also shown. While in some applications corruption of the first bit is allowed, corruption of multiple bits is not typically allowed.

Now discussed are circuits that when added to a capless LDO in a voltage-modulated high-speed TX driver, for example, reduce bit corruption and voltage ripple both at start-up and while in continuous operation. While these circuits are discussed in an eUSB application (e.g. 480 Mbps/240 MHz), they are equally applicable to any voltage mode line-driver. These circuits can be used with any capless LDO having a fast changing load. With these circuits, there is no need for an external capacitor (e.g. $C_{LDO}$) and an extra pin to connect thereto.

While these circuits are good for any eUSB2.0 transmitter/repeater which is in 1.2V domain while chip supply is in higher voltage domain, they are also applicable to any application which needs a fast changing current.

Figure 5:
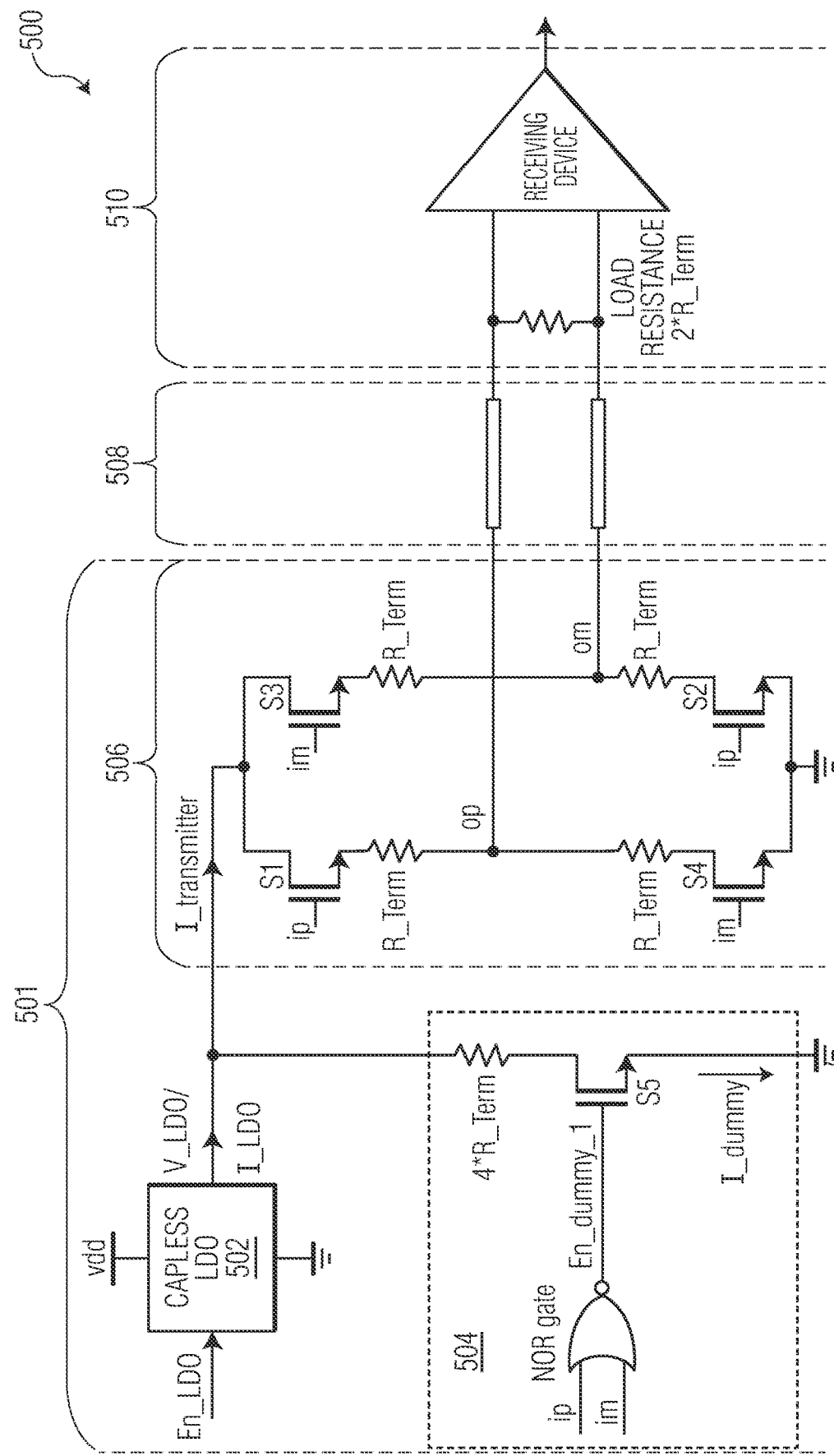
FIG. 5 represents a first example a signal (voltage mode TX) driver circuit.

FIG. 5 represents a first example 500 a signal driver circuit 501. The example 500 includes a capless LDO 502, a start-up dummy load 504, and a voltage mode line driver 506. The signal driver circuit is coupled to a communications channel 508 that is itself coupled to a receiving device 510. The receiving device 510 has a differential termination impedance of 2*R_Term.

The start-up dummy load 504 is configured to receive differential input signals (Im and Ip) which are also received by the voltage mode line driver 506 as shown. The start-up dummy load 504 is coupled between the LDO's 502 regulated voltage output (V_LDO) and a reference potential 512.

Generally, the start-up dummy load 504 is coupled to receive the differential input signals and draw a first current (first start-up dummy load current (I_dummy)) from the regulated voltage output of the LDO 502 when the input signal is in a first state (e.g. no input signal) and draw a second current (second start-up dummy load current (I_dummy)) from the regulated voltage output of the LDO 502 when the input signal is in a second state (e.g. either one of Ip or Im asserted in this example embodiment).

The start-up dummy load 504 includes a NOR gate, a switch (S5) and an impedance (4*R_Term). The total load current of the I_LDO=I_dummy+I_transmitter, where I_transmitter is drawn by the voltage mode line driver 506. The start-up dummy load 504 impedance is equal to twice the receiving device 510 termination impedance (i.e. 2*2*R_Term=4*R_Term).

After the signal driver circuit 501 warms up, but before differential input signal transmission has started, both ip and im are at a logic "low", and the output of the NOR gate is at a logic "high". Therefore, switch S5 is on, and the drawn start-up dummy current I_dummy from LDO=V_LDO/(4*R_Term). And the transmitter current I_transmitter=0 mA as described earlier. Therefore, LDO=I_dummy+I_transmitter=V_LDO/(4*R_Term)+0=V_LDO/(4*R_Term).

After differential input signal transmission has started, either ip or im toggles from low to high and S1 and S2 or S3 and S4 are periodically enabled and the voltage mode line driver 506 starts to draw a of I_transmitter=V_LDO/(4*R_Term). Also during the transient of startup, the output of the NOR gate toggles to logic "low", and S5 is turned off. And I_dummy=0 mA. Therefore, LDO=I_dummy+I_transmitter=0 mA+V_LDO/(4*R_Term)=V_LDO/(4*R_Term).

Thus the total LDO 502 load current (I_LDO) is substantially un-changed at V_LDO/(4*R_Term), thereby minimizing any ripple voltage at the LDO's 502 output. In other words a summation of the voltage mode line driver 506 current (I_transmitter) and the start-up dummy load 504 current (I_dummy) is substantially a constant current thus minimizing bit corruption at start-up.

Figure 6:
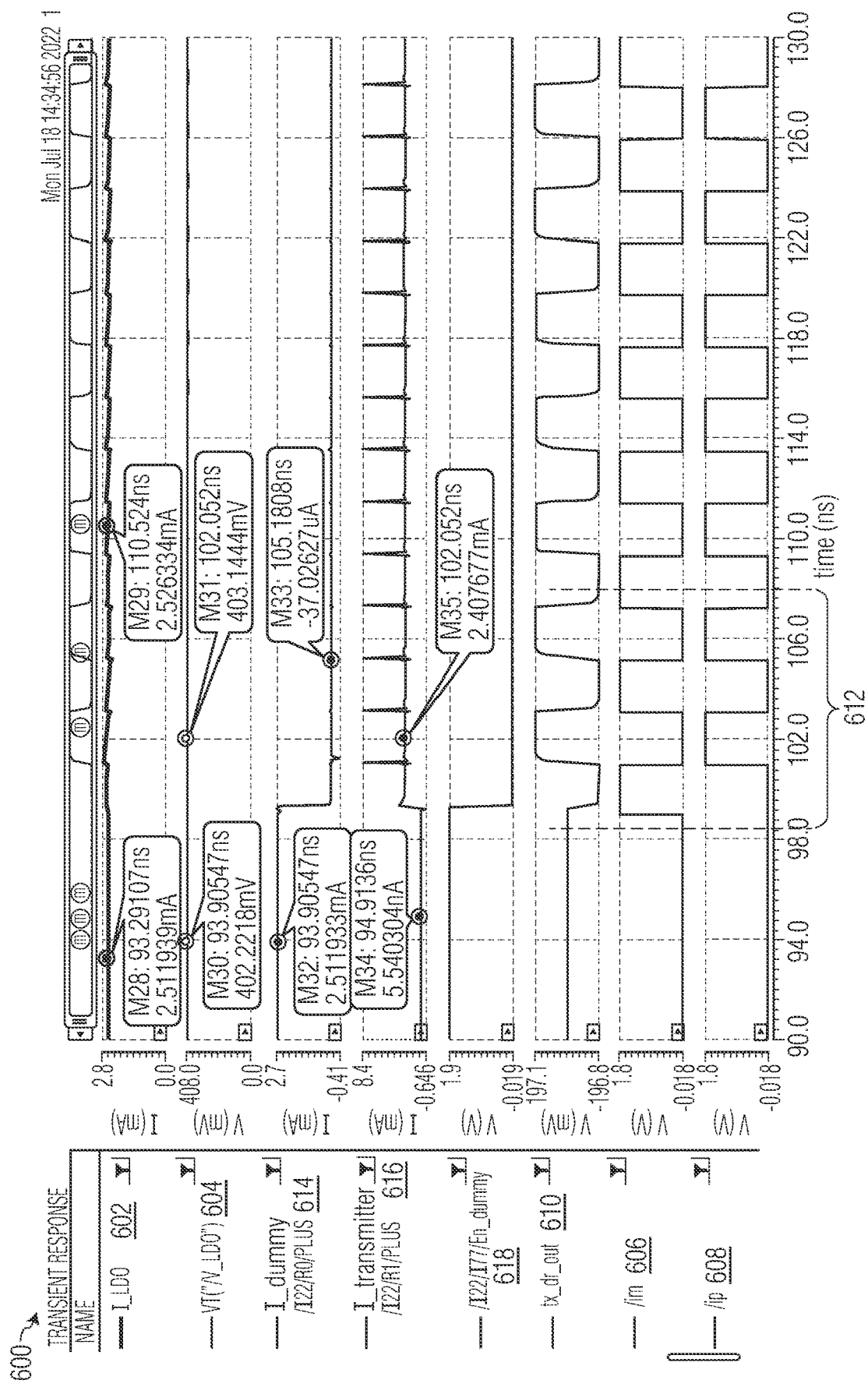
FIG. 6 represents an example timing diagram for the first example signal driver circuit.

FIG. 6 represents an example timing diagram 600 for the first example 500 the signal driver circuit 501. The example timing diagram 600 shows: I_LDO 602, V_LDO 604, differential input signals (Im 606 and Ip 608), one differential output signal 610 (tx_dr_out), start-up dummy load current (I_dummy) 614, voltage-mode line driver current (I_transmitter) 616, and an enable dummy circuit signal (En_dummy) 618.

Thus using the first example 500 the signal driver circuit 501 the differential input signals (Im 606 and Ip 608) are, at the output of the voltage-mode line driver 506, clean bits 612 and not corrupted.

Now discussed are circuits for reducing output voltage ripple due to a capless LDO's load current sourcing limitations while switching de-emphasis levels as introduced above. De-emphasis (DE) loading can change within nanoseconds and a capless LDO may not be able to track the changing load fast enough which means quality of output signal will drop. The circuits now discussed maintain output signal quality even as a de-emphasis level is switched.

Figure 7A:
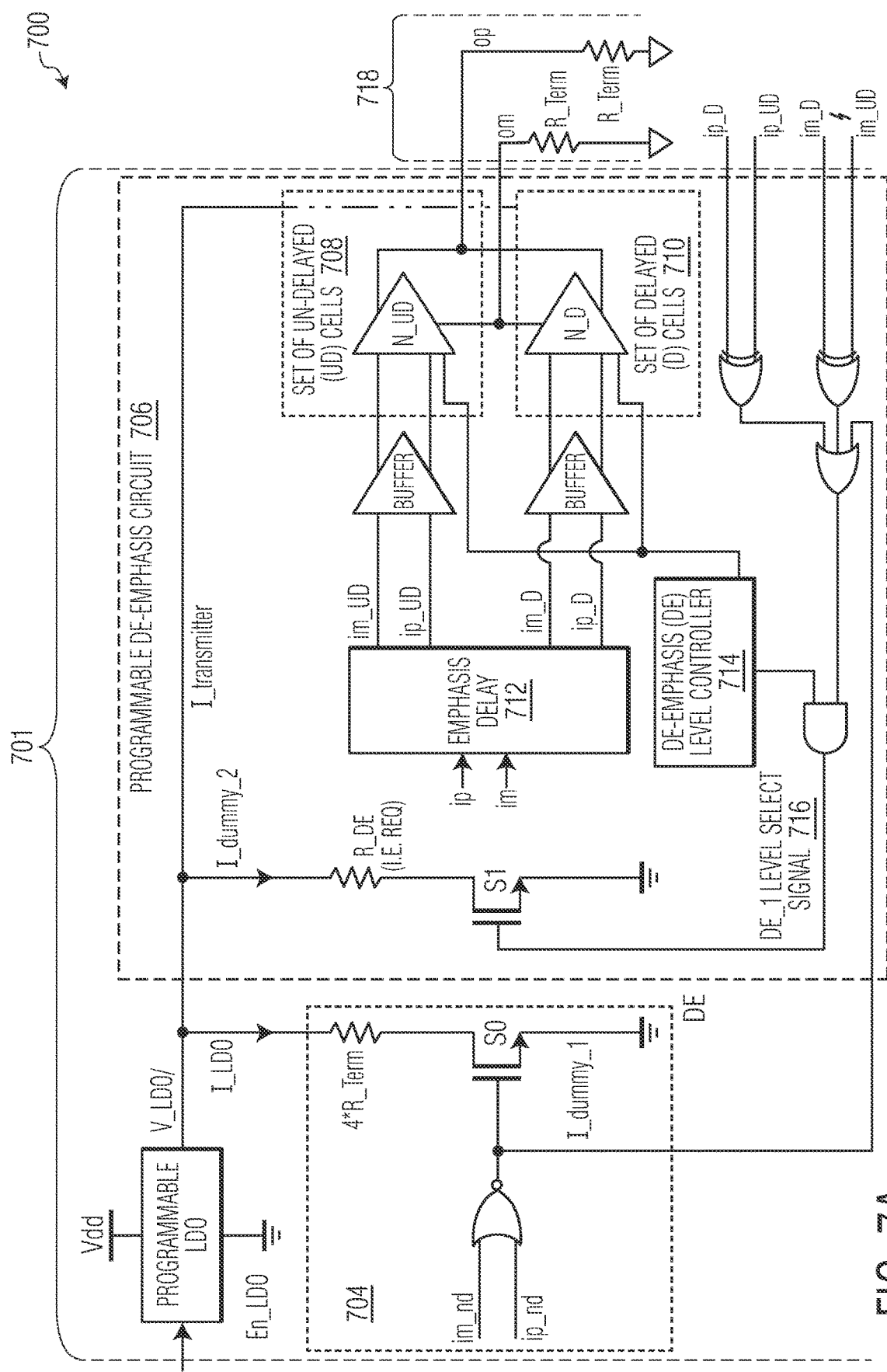
FIG. 7A represents a second example a signal driver circuit.

FIG. 7A represents a second example 700 a signal driver circuit 701. The second example 700 shows a signal driver circuit 701 coupled to receive differential input signals (Im and Ip), amplify those signals and generate differential output signals (om and op) which are then transmitted over a differential communications channel to a receiving device 718 having R_Term termination impedances.

The signal driver circuit 701 includes a capless LDO 702, a dummy load 704, and a programmable de-emphasis circuit 706. The dummy load 704 includes a NOR gate, switch (S0), impedance (4*R_Term), and draws a first dummy load current (I_dummy_1) when the switch is activated. The dummy load 704 receives the differential input signals (Im and Ip) and operates substantially as discussed in FIG. 5.

The programmable de-emphasis circuit 706 includes a set of un_delayed (N_UD) voltage-mode line driver cells 708, a set of delayed (N_D) voltage-mode line driver cells 710, an emphasis delay 712, a set of buffers, a de-emphasis (DE) level controller 714 that generates a DE_1 level select signal 716, and a DE level switch (S1) that sinks a second dummy load current (I_dummy_2). The programmable de-emphasis circuit 706 sinks a voltage-mode line driver current (I_transmitter), and also receives the differential input signals (Im and Ip) at various circuit locations as shown. To support different output swing levels, LDO output voltage can be programmable.

The following Table shows an example set of four DE Levels (0, 1, 2, 3). For each DE Level a prespecified number of delayed voltage-mode driver cells are activated in the set of un_delayed (N_UD) voltage-mode line driver cells 708, and a prespecified number of un_delayed voltage-mode driver cells are activated in the set of delayed (N_D) voltage-mode line driver cells 710.

| DE Level | NT (Total # Driver Cells) | Number of un_delayed_cells (N_UD) | Number of delayed_cells (N_D) | De-Emphasis (dB) |
|---|---|---|---|---|
| Level_0 | 50 | 50 | 0 | 0.00 |
| Level_1 (DE_1) | 50 | 48 | 2 | 0.72 |
| Level_2 (DE_2) | 50 | 46 | 4 | 1.51 |
| Level_3 (DE_3) | 50 | 44 | 6 | 2.38 |

In FIG. 7A and the discussion to follow there are only two DE Levels (0 and 1). Level_0 is completely un_delayed and corresponds to the circuit in FIG. 5. Level_1 is now discussed.

Figure 7B:
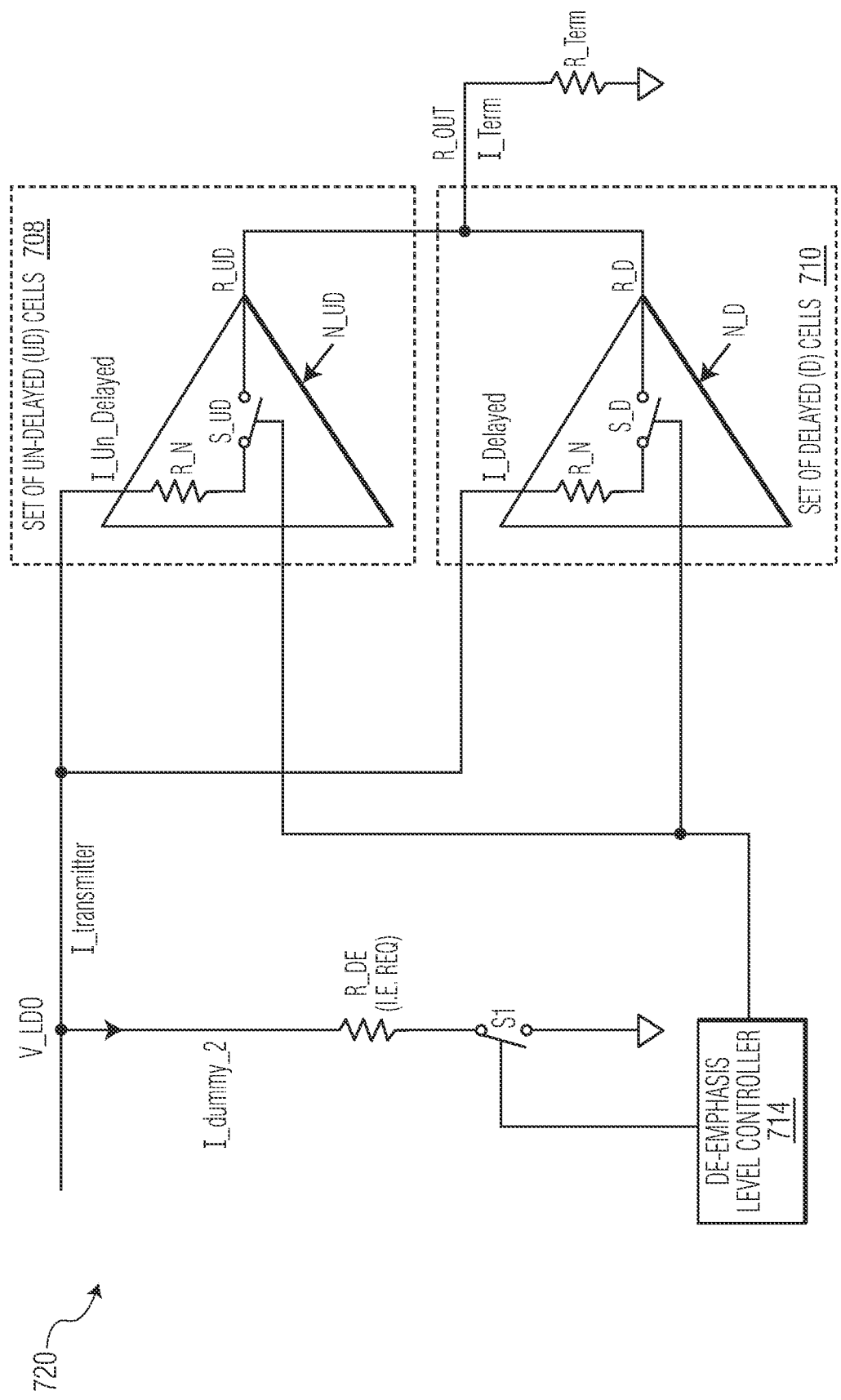
FIG. 7B represents a simplified version of the second example of the signal driver circuit.
Figure 7C:
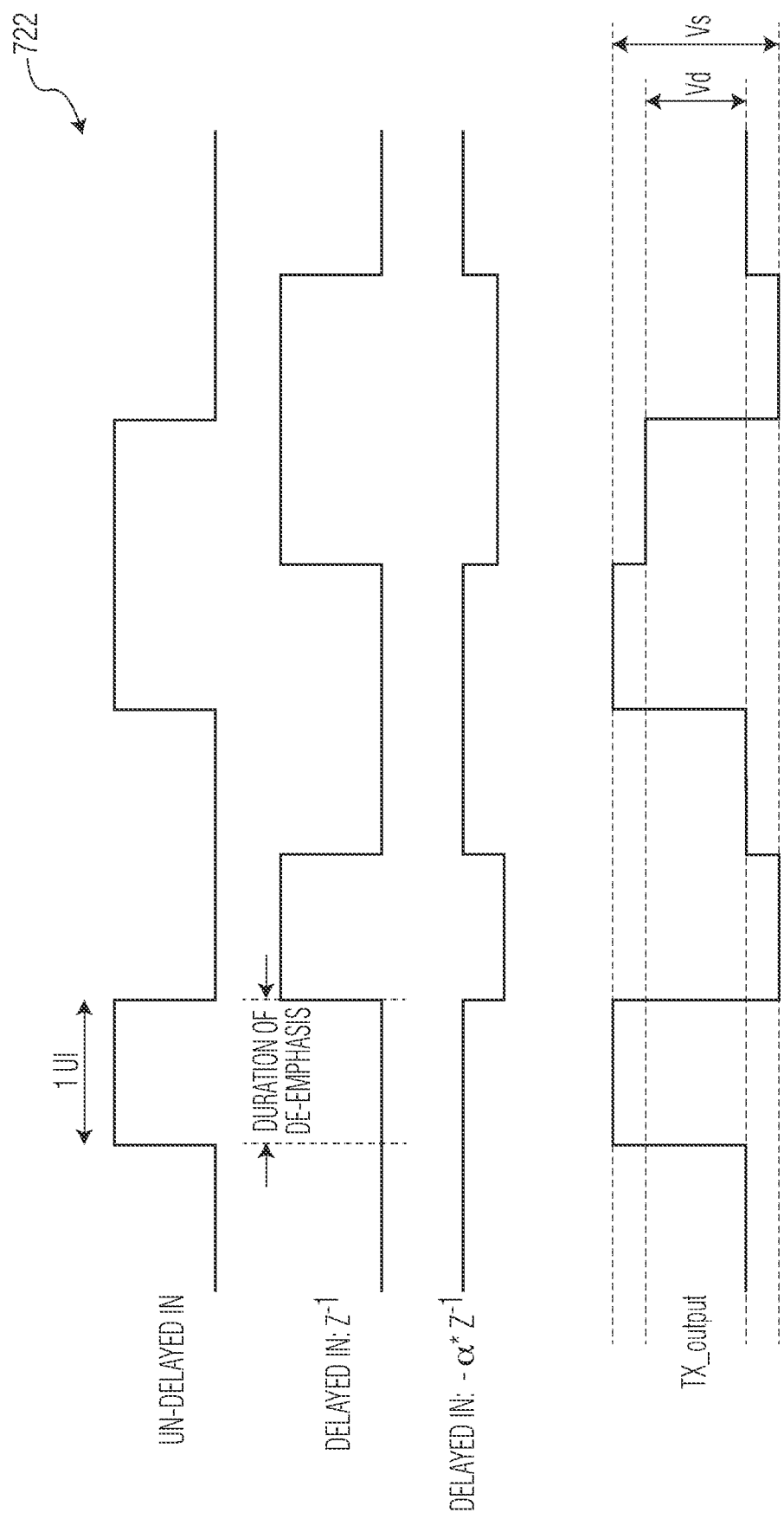
FIG. 7C represents an example timing diagram for the second example of the signal driver circuit.

Refer to FIG. 7C, de-Emphasis (DE) (dB)=20*log($V_s/V_d$)=20*log((1+α)/(1−α)), where: a number of un_delayed_cells (N_UD) is normalized to 1, and a number of delay_cells is normalized to α.

FIG. 7B represents a simplified version 720 of the second example 700 of the signal driver circuit 701. The simplified version 720 shows only one un_delayed (real number will be N_UD) voltage-mode line driver cell (i.e. R_N and S_N) and one delayed (real number will be N_D) voltage-mode line driver cell (i.e. R_N and S_D). Both cells are controlled by the de-emphasis (DE) level controller 714.

FIG. 7C represents an example timing diagram 722 for the second example 700 of the signal driver circuit 701 and shows how de-emphasis works. As is seen in the TX-output (e.g. differential output signals (om and op)) will have two levels, Vs and Vd where Vs represents DE Level_0 and Vd represents DE Level_1. The emphasis delay 712 sets a duration of each de-emphasis level equal to 1 UI (unit interval).

An example set of calculations and operating parameters are now discussed. In other example embodiments and/or applications these calculations and operating parameters may be different. RON of switches (S1, S_N, S_D) will be considered zero to simplify the discussion below.

For R_Term=40Ω (i.e. differential R_Term=80Ω), ratio of delayed and un_delayed cells is chosen to provide a required de-emphasis level. Considering R_N=2000Ω, NT=50 (see Table), NT=N_UD+N_D, R_Term=40Ω (eUSB single ended termination resistor), RU=R_Term*NT=40Ω*50=2000Ω, RD=RU/N_D, R_UD=RU/N_UD.

When only un-delayed cells are in place, then: R_Out=R_N/N_UD=R_Term*NT/N_UD and Vout=$V_d$. When all cells are in place, then R_Out=R_N/N_UD∥R_N/N_D=R_N/(N_UD+N_D)∥R_N/NT=R_Term, and Vout=Vs.

When only un-delayed cells are in place, then IT=V_LDO/(R_UD+R_Term)=V_LDO/(RU/N_UD+R_Term). IT when all delayed and un-delayed cells are in place is IT=V_LDO/(R_UD∥RD+R_Term)=V_LDO/(R_Term+R_Term).

When only un-delayed cells are in place, then R_Out will be higher (>R_Term), means equal impedance is higher, means less LDO current is needed, IT is smaller, swing is smaller ($V_d$). When all delayed and un-delayed cells are in place, R_Out is smaller (=R_Term), means IT is larger, swing is larger ($V_s$).

Difference between two currents will be: Delta (IT)=V_LDO/(R_Term+R_Term)−V_LDO/(R_Term+R_Term*NT/N_UD)=(V_LDO/R_Term)/(½−1/(1+NT/N_UD))=V_LDO/(2*R_Term*(NT−N_UD/NT+N_UD))=V_LDO/(2*R_Term*N_D/(NT+N_UD)=V_LDO/(2*R_Term*N_D/(N_D+N_UD+N_UD)=V_LDO/(2*R_Term*N_D/(N_D+2*N_UD).

This means that when delayed cells are not in place, the extra current should be switched off to ground to have a fix LDO current during all the time that the voltage-mode line driver cells 708, 710 are operating.

An equivalent resistor to ground in the I_dummy_2 and S1 path is R_DE (i.e. Req). Req=R_DE=2*R_Term*N_D/ (N_D+2*N_UD)=2*R_Term/(1+2*N_UD/N_D). The current path with Req will be enabled when the delayed cell is switched off. This will keep the LDO output current constant during the transmission with DE.

A timing of the differential input signals (Im and Ip) to differential output signals (om and op) conversion is set by the im_UD, ip_UD, im_D and ip_D signal from the emphasis delay 712 are sent to two XOR gates to detect the delay of ip and in, respectively, and an OR gate to, in conduction with the de-emphasis (DE) level controller 714, enable the second dummy load current (I_dummy_2).

Figure 7D:
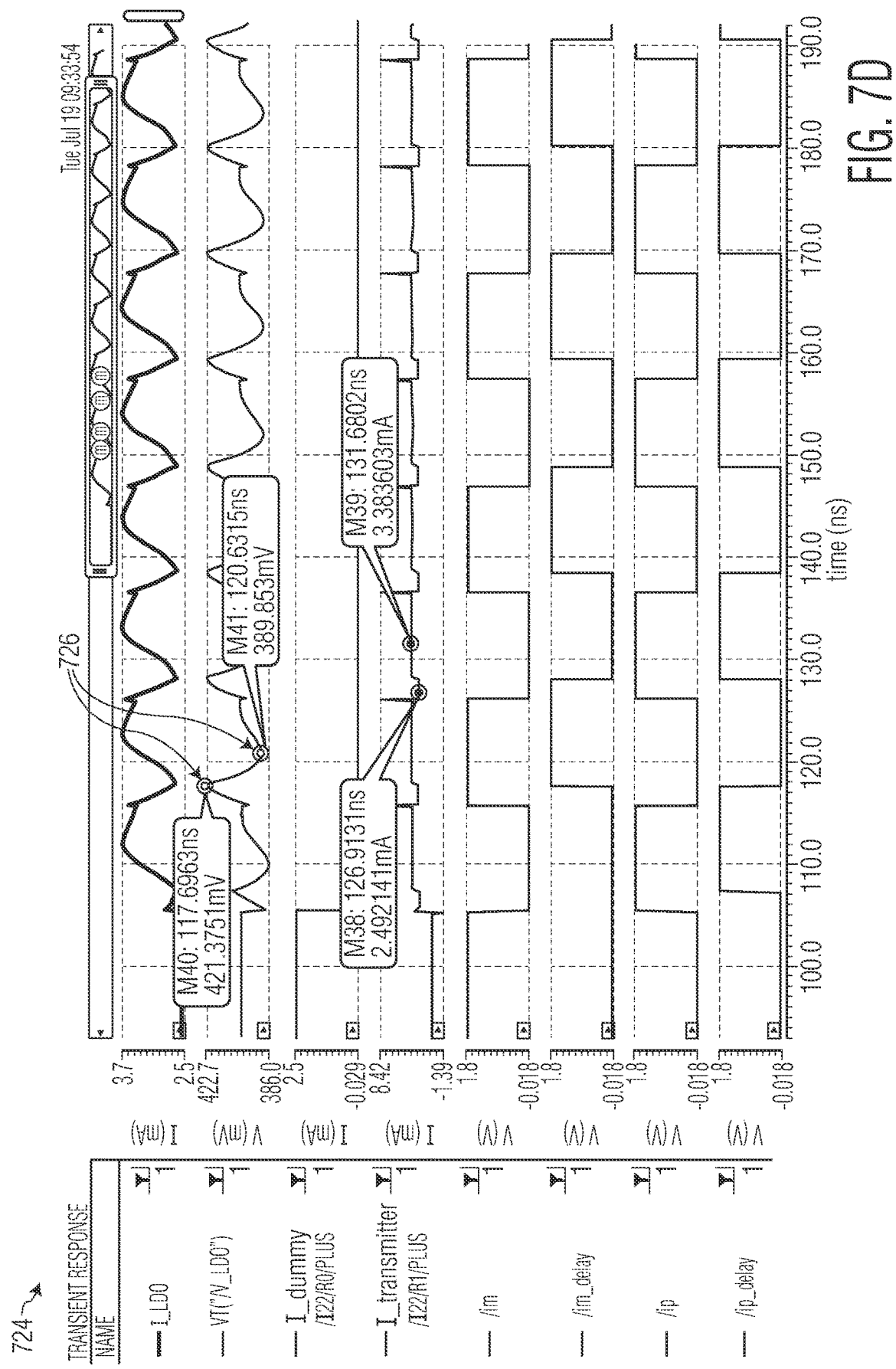
FIG. 7D represents an example timing diagram for the second example of the signal driver circuit for DE Level-0 (e.g. without the compensation of I_dummy_2).

FIG. 7D represents an example timing diagram 724 for the second example 700 of the signal driver circuit 701 for DE Level-0 (e.g. without the compensation of I_dummy_2). As can be seen a voltage ripple 726 on V_LDO is 421 mV–389 mV~32 mV which can affect differential output signals (om and op) signal quality.

Figure 7E:
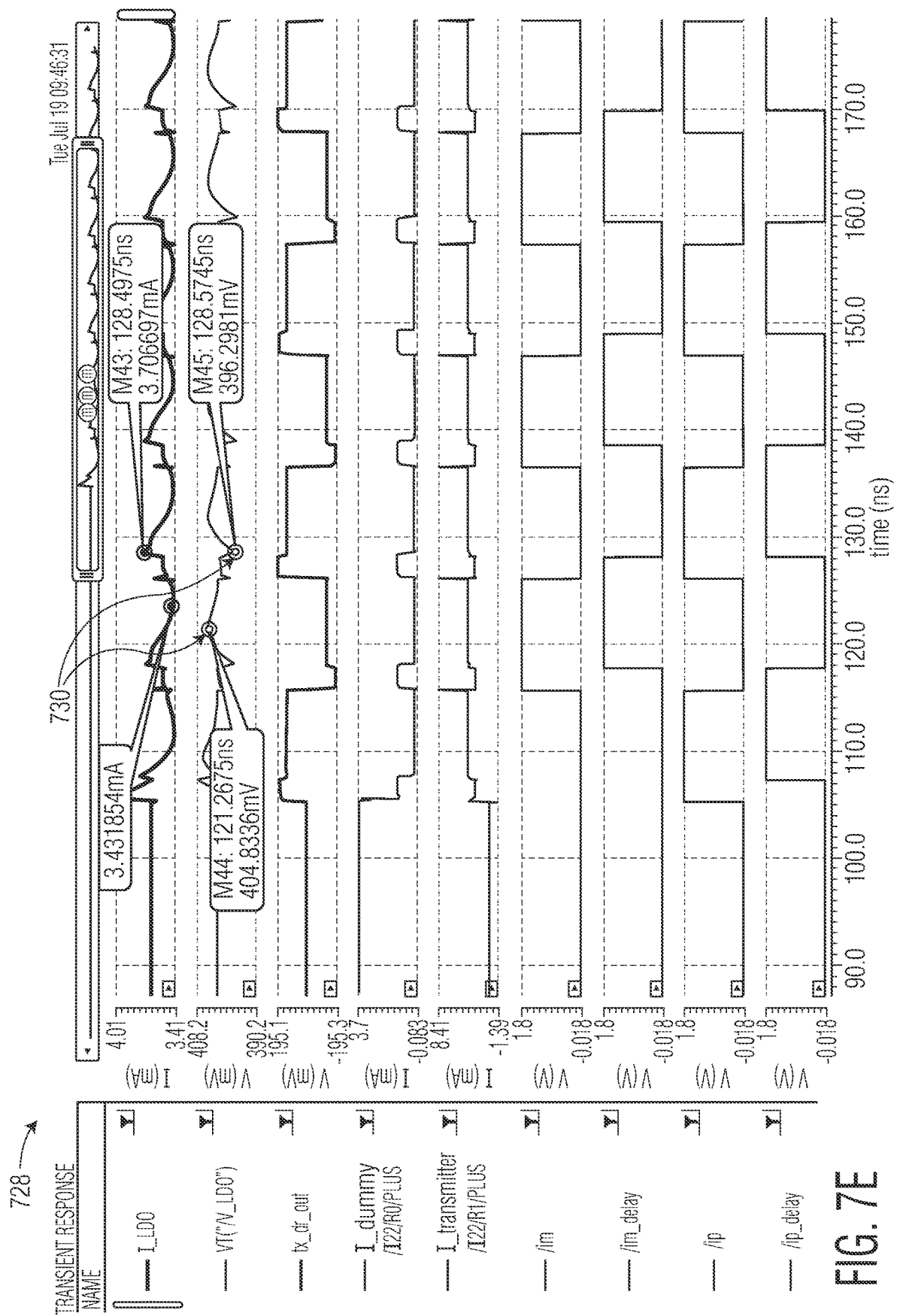
FIG. 7E represents an example timing diagram for the second example of the signal driver circuit for DE Level-1 (e.g. with the compensation of I_dummy_2).

FIG. 7E represents an example timing diagram 728 for the second example 700 of the signal driver circuit 701 for DE Level-1 (e.g. with the compensation of I_dummy_2). Here the second dummy load current (I_dummy_2) deemphasis dummy current is selectively added and balances the transmitter current (I_transmitter). As a result a voltage ripple 730 on the V_LDO is reduced (i.e. 404.8 mV–396.3 mV~8.5 mV), which is almost ¼ of the Level_0 voltage ripple 726.

Figure 8:
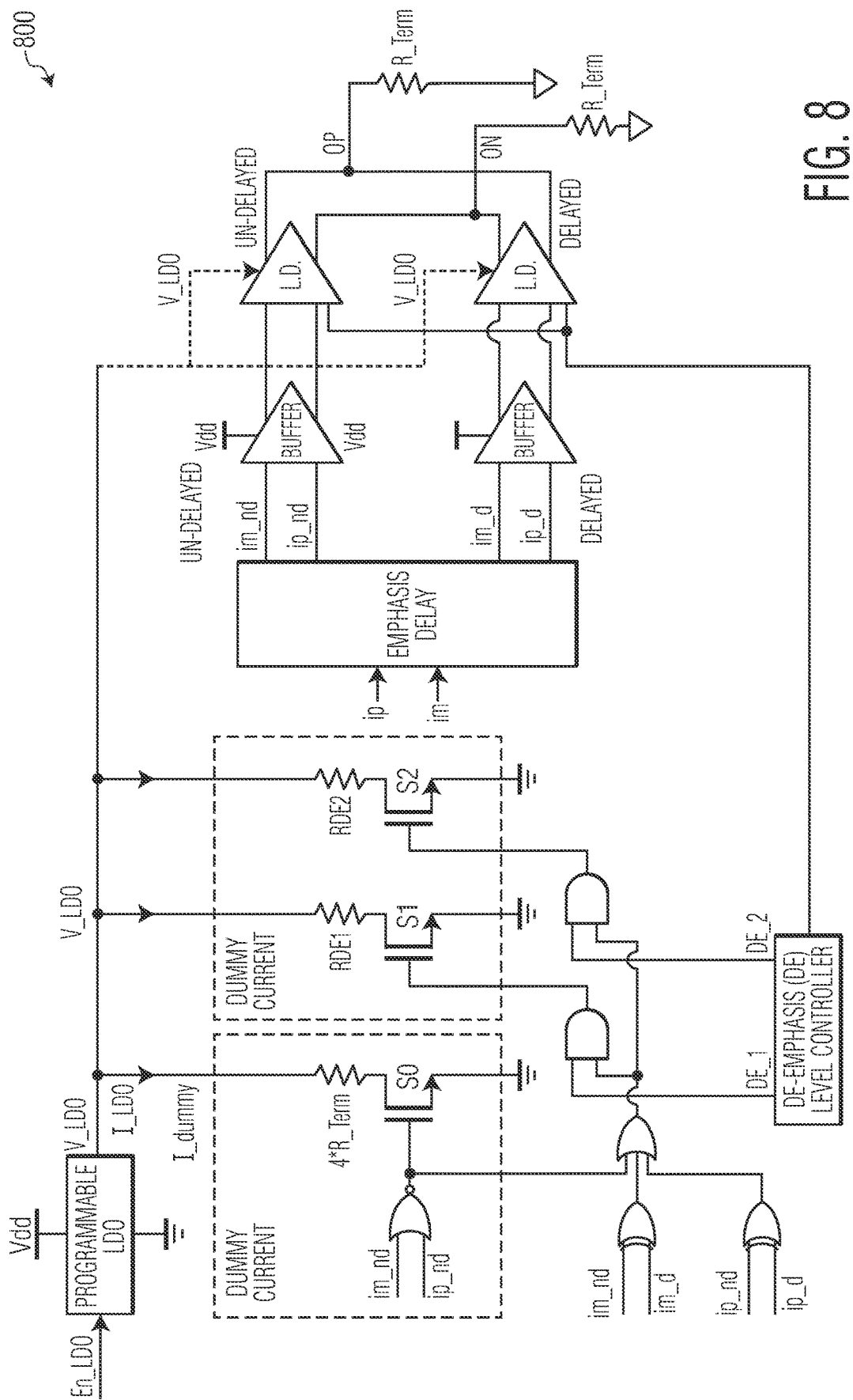
FIG. 8 represents a third example a signal driver circuit.

FIG. 8 represents a third example 800 a signal driver circuit. In this example 800 there are three DE Levels (0, 1 (DE_1) and 2 (DE_2)) as shown. Otherwise the operation of the third example 800 is substantially a scaled version of the second example 700 of the signal driver circuit.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A signal driver circuit, comprising:
   an input configured to receive an input signal;
   an output configured to transmit an output signal;
   a low drop-out voltage regulator (LDO) having a regulated voltage output;
   a set of voltage-modulated amplifiers having a first input coupled to the regulated voltage output, and a second input configured to receive the input signal;
   wherein the voltage-modulated amplifier is configured to amplify the input signal and transmit an amplified input signal on the output of the signal driver circuit;
   a de-emphasis controller, including a set of de-emphasis levels;
   wherein the de-emphasis controller is configured to selectively switch-on a first subset of the set of voltage-modulated amplifiers and switch-off a second subset of the set of voltage-modulated amplifiers based on the de-emphasis levels;

further comprising a set of de-emphasis dummy loads coupled between the regulated voltage output and a reference potential;

wherein each de-emphasis dummy load in the set of de-emphasis dummy loads is configured to draw a de-emphasis dummy load current from the regulated voltage output of the LDO if the de-emphasis dummy load is switched-on;

wherein the set of de-emphasis dummy loads are coupled to receive the input signal;

wherein the de-emphasis dummy load is switched-on if the input signal is in a logic low state; and wherein the de-emphasis dummy load is switched-off if the input signal is in a logic high state.

2. The circuit of claim 1:
wherein the first subset is a set of un-delayed voltage-modulated amplifiers and the second subset is a set of delayed voltage-modulated amplifiers; and
wherein the de-emphasis levels are set based on a ratio of the set of un-delayed voltage-modulated amplifiers to the set of delayed voltage-modulated amplifiers.

3. The circuit of claim 1:
wherein the de-emphasis levels include a first de-emphasis level and a second de-emphasis level.

4. The circuit of claim 3:
wherein the de-emphasis controller is configured to switch-on all of the voltage-modulated amplifiers for the first de-emphasis level.

5. The circuit of claim 3:
wherein a voltage ripple at the output of the signal driver circuit decreases as the switched-on voltage-modulated amplifiers in the second subset increases.

6. The circuit of claim 3:
wherein a de-emphasis of the input of the signal driver circuit increases as the switched-on voltage-modulated amplifiers in the second subset increases.

7. The circuit of claim 1:
wherein the set of voltage-modulated amplifiers are configured to draw a first current;
wherein the set of de-emphasis dummy loads are configured to draw a second current; and
wherein a summation of the first current and the second current is substantially a constant current.

8. The circuit of claim 1:
wherein the de-emphasis levels include a first de-emphasis level and a second de-emphasis level.

9. The circuit of claim 8:
wherein the de-emphasis controller is configured to switch-off all of the de-emphasis dummy loads for the first de-emphasis level.

10. The circuit of claim 8:
wherein the de-emphasis controller is configured to switch-on at least one of the de-emphasis dummy loads for the second de-emphasis level.

11. The circuit of claim 1:
wherein the LDO is a capless LDO.

12. The circuit of claim 11:
wherein the signal driver circuit is completely embodied in a single integrated circuit.

13. The circuit of claim 1:
wherein the signal driver circuit is an e-USB transmit signal driver circuit.

14. The circuit of claim 1:
wherein the input signal is a differential input signal; and
wherein the output signal is a differential output signal.

15. The circuit of claim 1:
further comprising a start-up dummy load coupled between the regulated voltage output and a reference potential;
wherein the start-up dummy load is coupled to receive the input signal and configured to draw a start-up dummy load current from the regulated voltage output of the LDO; and
wherein the dummy load current equals a first current when the input signal is in a first state and equals a second current when the input signal is in a second state.

16. The circuit of claim 15:
wherein the dummy load includes a NOR gate, a switch, and a dummy impedance;
wherein the output of the signal driver circuit is configured to be coupled to a load termination impedance (R_Term); and
wherein the dummy impedance is equal to twice the termination impedance (R_Term).

17. The circuit of claim 15:
wherein the voltage mode line driver is configured to draw a voltage-mode line driver current; and
wherein a summation of the voltage mode line driver current and the start-up dummy load current is substantially a constant current.

18. The circuit of claim 1:
wherein the input signal is a differential input signal having an ip component and an im component;
wherein the de-emphasis dummy load includes a NOR gate coupled to receive the ip component and the im component;
wherein the NOR gate switches the de-emphasis dummy load on if both the ip component and the im component are in a logic low state; and
wherein the NOR gate switches the de-emphasis dummy load off if either or both the ip component and the im component are in a logic high state.

19. A signal driver circuit, comprising:
an input configured to receive an input signal;
an output configured to transmit an output signal;
a low drop-out voltage regulator (LDO) having a regulated voltage output;
a set of voltage-modulated amplifiers having a first input coupled to the regulated voltage output, and a second input configured to receive the input signal;
wherein the voltage-modulated amplifier is configured to amplify the input signal and transmit an amplified input signal on the output of the signal driver circuit;
a de-emphasis controller, including a set of de-emphasis levels;
wherein the de-emphasis controller is configured to selectively switch-on a first subset of the set of voltage-modulated amplifiers and switch-off a second subset of the set of voltage-modulated amplifiers based on the de-emphasis levels;
further comprising a start-up dummy load coupled between the regulated voltage output and a reference potential;
wherein the start-up dummy load is coupled to receive the input signal and configured to draw a start-up dummy load current from the regulated voltage output of the LDO; and wherein the start-up dummy load current equals a first current when the input signal is in a first state and equals a second current when the input signal is in a second state;

wherein the start-up dummy load is switched-on if the input signal is in the first state; and wherein the start-up dummy load is switched-off if the input signal is in the second state.

20. A signal driver circuit, comprising:

an input configured to receive an input signal;

an output configured to transmit an output signal;

a low drop-out voltage regulator (LDO) having a regulated voltage output;

a set of voltage-modulated amplifiers having a first input coupled to the regulated voltage output, and a second input configured to receive the input signal;

wherein the voltage-modulated amplifier is configured to amplify the input signal and transmit an amplified input signal on the output of the signal driver circuit;

a de-emphasis controller, including a set of de-emphasis levels;

wherein the de-emphasis controller is configured to selectively switch-on a first subset of the set of voltage-modulated amplifiers and switch-off a second subset of the set of voltage-modulated amplifiers based on the de-emphasis levels;

further comprising a start-up dummy load coupled between the regulated voltage output and a reference potential;

wherein the start-up dummy load is coupled to receive the input signal and configured to draw a start-up dummy load current from the regulated voltage output of the LDO;

wherein the start-up dummy load current equals a first current when the input signal is in a first state and equals a second current when the input signal is in a second state;

wherein the dummy load includes a NOR gate, a switch, and a dummy impedance;

wherein the output of the signal driver circuit is configured to be coupled to a load termination impedance (R_Term); and wherein the dummy impedance is equal to twice the termination impedance (R_Term).

* * * * *